(12) United States Patent
Nakano et al.

(10) Patent No.: US 6,648,652 B2
(45) Date of Patent: Nov. 18, 2003

(54) SIGNAL TRANSMISSION CONNECTOR AND CABLE EMPLOYING SAME

(75) Inventors: Yoshihiro Nakano, Machida (JP); Takashi Yanagisawa, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/832,468

(22) Filed: Apr. 11, 2001

(65) Prior Publication Data
US 2001/0034142 A1 Oct. 25, 2001

(30) Foreign Application Priority Data
Apr. 14, 2000 (JP) .................................... 2000-114291

(51) Int. Cl.[7] .............................................. H01R 12/00
(52) U.S. Cl. ......................... 439/55; 439/884; 439/65; 174/117 F; 361/777
(58) Field of Search ...................... 439/55, 65, 884; 174/261, 117 F; 333/246, 34, 33, 32; 361/777

(56) References Cited

U.S. PATENT DOCUMENTS

| | | | | | |
|---|---|---|---|---|---|
| 2,898,521 A | * | 8/1959 | Creveling | .................... | 174/260 |
| 3,320,573 A | * | 5/1967 | Machs et al. | ................ | 439/378 |
| 4,395,610 A | * | 7/1983 | Downs et al. | ................ | 200/292 |
| 4,434,321 A | * | 2/1984 | Betts | ........................... | 174/254 |
| 4,543,544 A | * | 9/1985 | Ziegner | ....................... | 333/238 |
| 4,552,420 A | * | 11/1985 | Eigenbrode, deceased | ... | 439/65 |
| 4,593,243 A | * | 6/1986 | Lao et al. | .................... | 324/754 |
| 4,615,604 A | * | 10/1986 | Yamada | ....................... | 174/260 |
| 4,767,338 A | * | 8/1988 | Dennis et al. | ............... | 439/455 |
| 4,837,529 A | * | 6/1989 | Gawronski et al. | .......... | 333/260 |
| 4,994,771 A | * | 2/1991 | Takamine et al. | ............ | 333/246 |
| 5,148,135 A | * | 9/1992 | Stein | ........................... | 174/260 |
| 5,160,904 A | * | 11/1992 | Babbitt et al. | ............... | 333/246 |
| 5,408,050 A | * | 4/1995 | Kashio et al. | ............ | 174/117 F |
| 5,541,369 A | * | 7/1996 | Tahara et al. | ........... | 174/117 FF |
| 5,583,468 A | * | 12/1996 | Kielmeyer et al. | .......... | 333/247 |
| 5,633,614 A | * | 5/1997 | Decramer | ..................... | 333/25 |
| 5,729,438 A | * | 3/1998 | Pieper et al. | ................. | 174/51 |
| 5,751,557 A | * | 5/1998 | Silva | .......................... | 361/777 |
| 5,764,497 A | * | 6/1998 | Mizumo | ..................... | 257/776 |
| 5,767,764 A | * | 6/1998 | Ida | .......................... | 340/407.1 |
| 5,790,383 A | * | 8/1998 | Inagawa | ..................... | 174/250 |
| 5,923,234 A | * | 7/1999 | Holzman et al. | ........... | 174/262 |
| 6,153,832 A | * | 11/2000 | Gaarder | ...................... | 174/254 |
| 6,235,997 B1 | * | 5/2001 | Asada et al. | ................ | 174/260 |

FOREIGN PATENT DOCUMENTS

EP 0 406 509 A1 * 9/1991 ............ H01B/7/00

* cited by examiner

*Primary Examiner*—Tho D. Ta
*Assistant Examiner*—Edwin A. León
(74) *Attorney, Agent, or Firm*—Carlos Munoz-Bustamante

(57) ABSTRACT

In a data processing system, a flexible cable includes a pattern of transmission lines formed thereon, the lines having a predetermined width. On the transmission lines are formed a first set of lands each for connecting a connection pin of an RJ45 connector and a second set of lands each for connecting a connection pin of a transmission line connector—each land being wider than a transmission line. A transition region is provided in each transmission line in the vicinity of the land, the width of the transition region increasing gradually from the line width to the land width as the transmission line approaches the pin.

10 Claims, 7 Drawing Sheets

SIGNAL TRANSMISSION CONNECTOR AND CABLE EMPLOYING SAME

FIELD OF THE INVENTION

The present invention relates generally to a signal transmission line connector, a signal transmission line, a signal transmission cable and a data processing system and more particularly to a signal transmission line connector, a signal transmission line, a signal transmission cable and a data processing system for use in a transmission line network such as an Ethernet network.

BACKGROUND OF THE INVENTION

When designing an Ethernet network, the design must conform to the ANSI IEEE Standard 802.3 1993, which regulates the design including that of the transmission circuit for each network adapter so as to assure correct operation of the network.

To provide a lap-top personal computer (PC) with Ethernet functions using a mini-PCI type network card of, for example, the Type III model, therefore, the PC includes a transmission line so as to correspond to the Ethernet.

However, in case the lap-top PC must be provided with a port replication function at an RJ45 port at such an extended unit side used as, for example, a docking station and/or in case a mechanically efficient transmission line is disposed in the lap-top PC, a transmission line connector other than the RJ45 connector must be used unavoidably on the transmission line network, although the use of such a nonstandard connector should be avoided originally.

When such a nonstandard transmission line connector is used, a return loss occurs at the connection area due to impedance mismatching. Consequently, a stationary wave is generated, thereby attenuating the signal. This disables the subject data communication, resulting in a communication error.

In such a case, a transmission line connector that satisfies the characteristics required for the Ethernet Standard should be used. Otherwise, it would be difficult to develop a new transmission line connector that agrees to the design requirement each time a system is developed when the number of processes and the cost are taken into consideration.

Japanese Published Unexamined Patent Application No. 9-51209, the contents of which are incorporated herein by reference, discloses a technique for preventing such impedance mismatching by changing both the permittivity of the substrate material and the width of the transmission line pattern. This technique, which unavoidably changes the permittivity of the substrate material gives rise to an increase in manufacturing cost.

Under such circumstances, it is an object of the present invention to provide a signal transmission line connector, a signal transmission line, and a substrate that can prevent the whole subject transmission line network from degradation of the transmission characteristics even when the network uses a transmission line connector whose characteristic impedance differs from that required for the transmission lines.

SUMMARY OF THE INVENTION

In order to attain the above object, the transmission line connector of the present invention enables a signal transmission line to be connected to a terminal area in an transition region. The transmission line is formed at a predetermined width so as to transmit a signal and the terminal area is formed at a specific width differently from the predetermined width so as to input/output a signal to be transmitted by the signal transmission line. The transition region is formed around the terminal area so that the predetermined width of the signal transmission line is changed gradually to the specific width of the terminal area in the transition region as the line goes towards the terminal area.

And, a plurality of such signal transmission lines are also formed on, for example, a flexible cable at a predetermined width therebetween and those transmission lines are used, for example, for communications among computers via a network. At an end or at a middle point of each of those transmission lines is formed a terminal area used to input/output a signal. This terminal area can be formed not only on the flexible cable, but also another type of substrate such as a printed circuit board. The terminal area has a specific width, which is different from that of the signal transmission line. Consequently, the impedance differs between the signal transmission line and the terminal area.

Consequently, in the present invention, the transition region is formed so that the predetermined width of the signal transmission line is changed gradually to the specific width of the terminal area therein as the line goes towards the terminal area and the transmission line is connected to the terminal area therein. And, because the width of the signal transmission line is changed gradually around the terminal area, the impedance around the terminal area can be prevented from an abrupt change even when the impedance differs between the signal transmission line and the terminal area. Consequently, a return loss to be expected around the terminal area can be reduced, thereby the attenuation of the signal can be prevented so as to assure normal communications.

The length of the transition region, that is, the length of the section in which the width of the signal transmission line is changed gradually, can be decided as follows, for example. At first, an impedance is found from an equalizing circuit of the signal transmission line system including the signal transmission line and the terminal area, then the area of the transition region, which is equivalent to the impedance, is found. This area can be found in accordance with the required impedance from the inductance and capacitance characteristics of the material of the signal transmission line. When the area of the transition region is decided, the length of the transition region can be found easily from the area, the predetermined width of the signal transmission line, and the specific width of the terminal area.

DETAILED DESCRIPTION OF THE INVENTION

Figure 1:
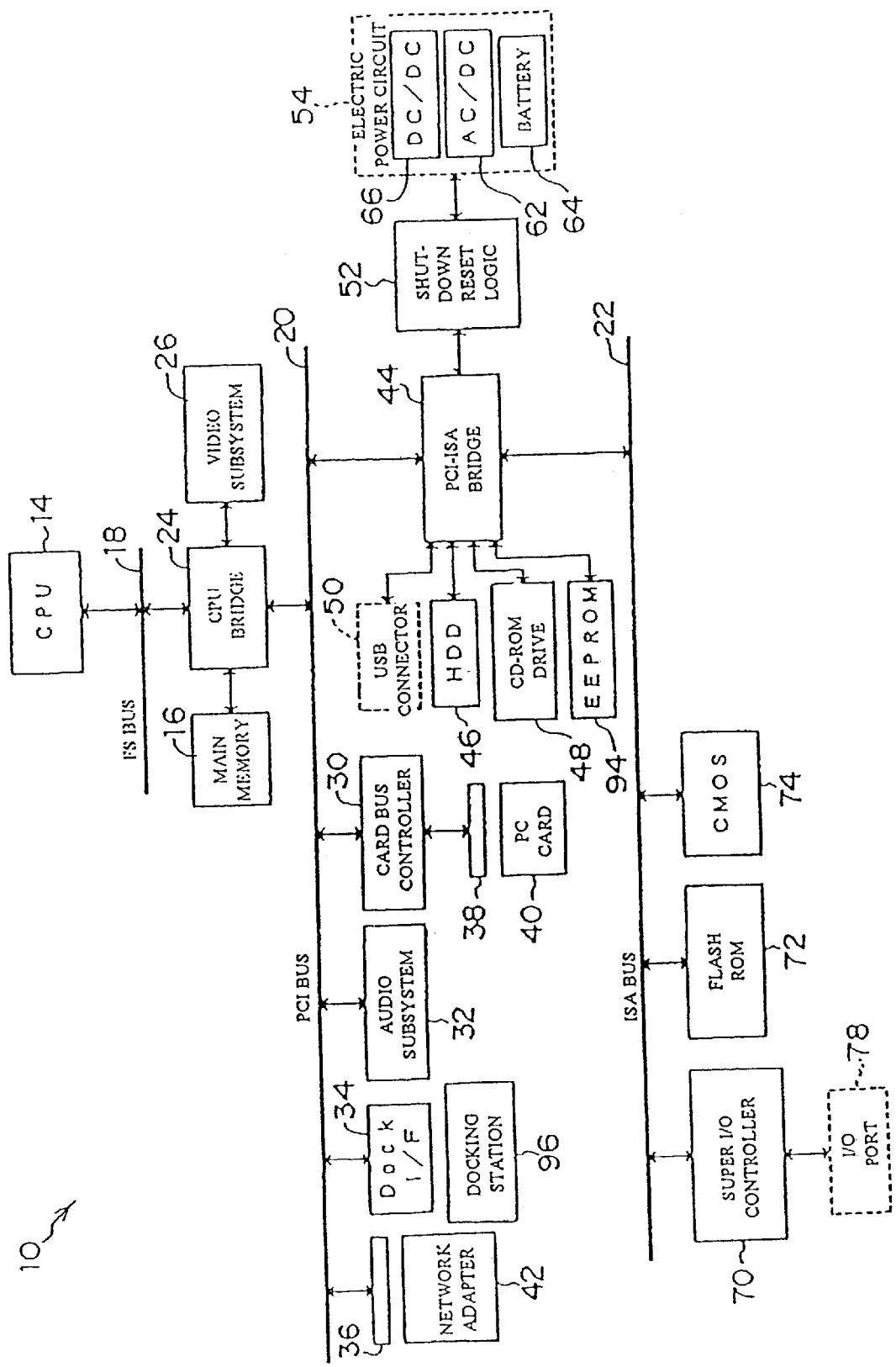
FIG. 1 is a schematic block diagram of an example computer system in which the present embodiment is employed.

Hereunder, the preferred embodiment of the present invention will be described with reference to the accompanying drawings. FIG. 1 shows a hardware block diagram of a computer system 10 configured by a typical personal computer (PC) preferred to realize the present invention. The computer system 10 is divided into subsystems in the explanatory view shown FIG. 1.

Figure 2:
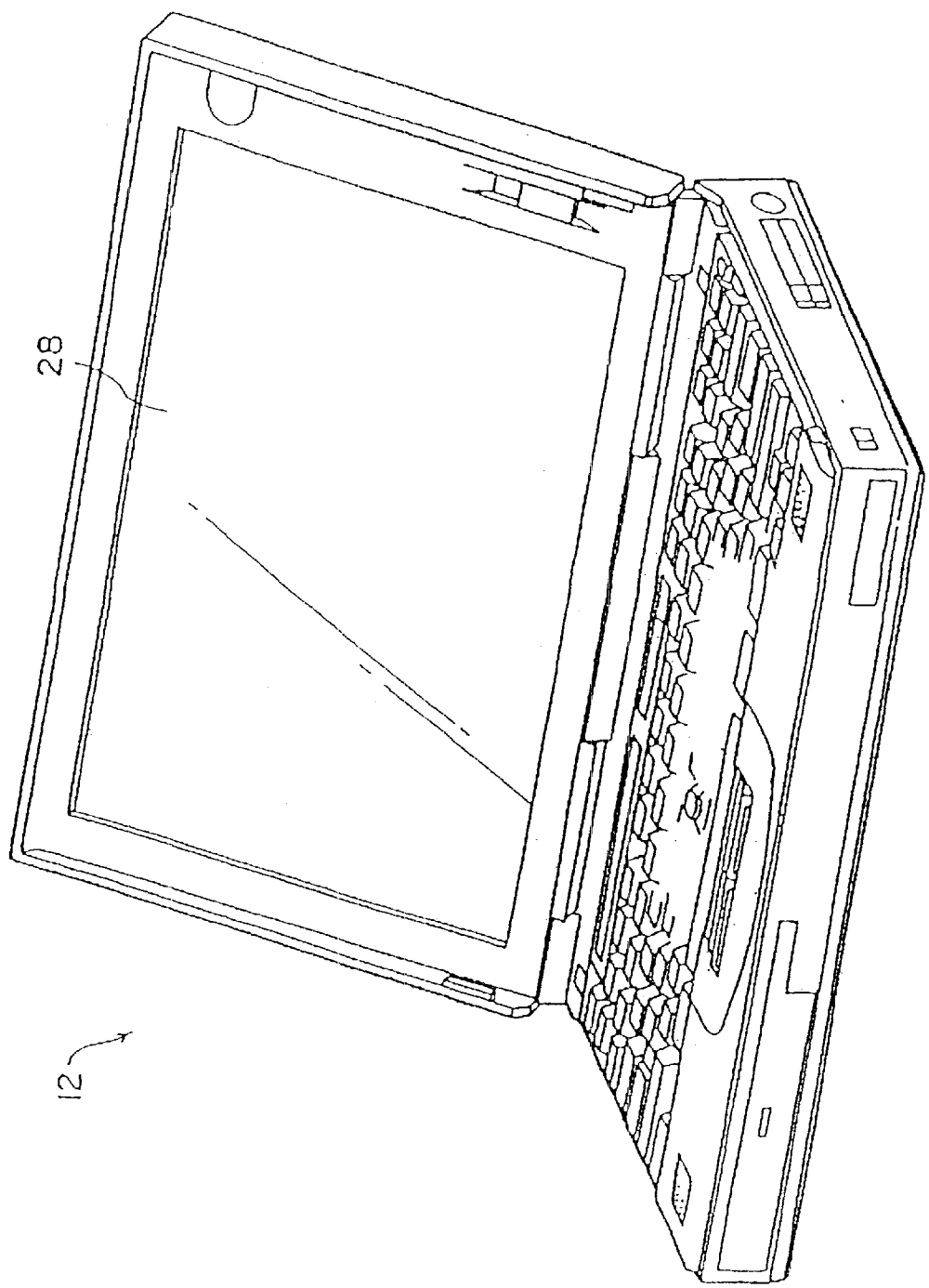
FIG. 2 is a perspective external view of a lap-top PC.

An example of a PC embodying the present invention is a lap-top PC 12 (see FIG. 2) that conforms to the OADG (PC Open Architecture Developer's Group) specifications and includes Windows98 or NT operating system (OS) from Microsoft Corp installed therein. Hereinafter, each component of the computer system 10 will be described.

A CPU 14 that functions as the brain of the computer system 10 executes various programs under the control of the OS. The CPU 14 may be one of the family of Pentium CPU chips (e.g."Pentium", "Pentium MMX", "Pentium Pro" and successors) sold by Intel Corporation. The CPU 14 may alternatively be a CPU from such other companies as AMD Inc or may be the "PowerPC" from IBM Corporation. The CPU 14 is configured so as to include an L2 (level 2) cache, which is a fast operation memory used to reduce the time of the total access to a main memory 16 by saving some codes and data items that are accessed frequently. Generally, the L2 cache is configured by an SRAM (Static RAM) chip.

The CPU 14 is connected to each of the hardware components via one or more buses of a three-layer bus configured by an FS (Front Side) bus 18, which is connected directly to the external pins of the processor (CPU 14); a PCI (Peripheral Component Interconnect) bus 20 used for fast I/O devices; and an ISA (Industry Standard Architecture) bus 22 used for slow I/O devices.

The FS bus 18 and the PCI bus 20 are connected to each other via a CPU bridge (host-PCI bridge) 24 referred to generally as a memory/PCI control chip. The CPU bridge 24 in this embodiment includes a memory controller function for controlling access to the main memory 16, a data buffer for absorbing a difference in the data transfer rate between the FS bus 18 and the PCI bus 20. For example, a 440BX (from Intel Corporation) can be used as the CPU bridge 24.

The main memory 16 is a writable memory used as an area in which an execution program of the CPU 14 is read or as a work area in which data processed by the execution program is written. The main memory 16 is configured by, for example, a plurality of DRAM (Dynamic RAM) chips.

The execution program mentioned here is, for example, any of various device drivers for operating peripheral devices, application programs dedicated to specific business works, and such firmware programs as the BIOS stored in the flash ROM 72.

The PCI bus 20 is of a type enabled to transfer data comparatively fast and the PCI bus 20 is connected to such PCI devices as a card bus controller 30. The PCI architecture was originally proposed by Intel Corporation and is used to realize the so-called PnP (Plug and Play) function.

The video subsystem 26 is used to execute video-related functions. The subsystem 26 includes a video controller that processes each graphic instruction from the CPU 14, writes the processed graphic information in the video memory (VRAM) once, and reads graphic information from the VRAM so as to display it on a liquid crystal display (LCD) 28 (see FIG. 2) as graphical data. The video controller can also convert digital video signals to analog video signals using the digital-analog converter (DAC) provided therein. The analog video signals are output to a CRT port (not illustrated) via a signal line.

The PCI bus 20 is connected to a card bus controller 30, an audio subsystem 32, a docking station interface (Dock I/F) 34, and a mini-PCI slot 36 respectively. The card bus controller 30 is used exclusively to connect the bus signal of the PCI bus 20 directly to the interface connector (card bus) of a PCI card bus slot 38. The card bus slot 38 is disposed, for example, on the wall surface of the PC 12 body and enabled to load a PC card 40 conforming to the specifications (ex., "PC Card Standard 95") regulated by PCMCIA (Personal Computer Memory Association)/(JEIDA (Japan Electric Industry Development Association).

Figure 3:
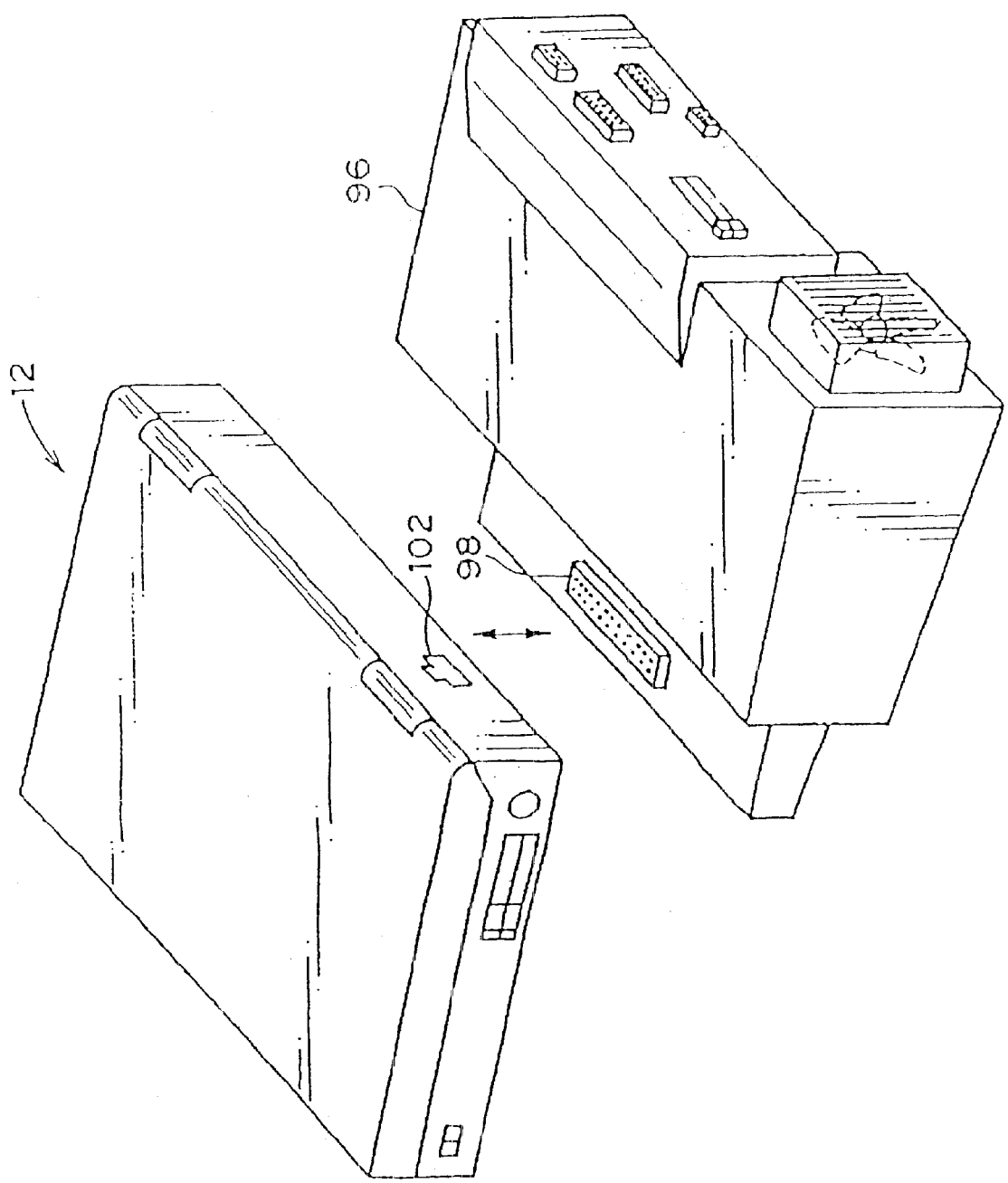
FIG. 3 is a perspective external view of the lap-top PC and a docking station.

The dock I/F 34 is a hardware component used to connect the PC 12 to the docking station 96 (also see FIG. 3). When a connector (not illustrated) of the PC 12 is connected to the connector 98 of the docking station 96 shown in FIG. 3, the PCI-PCI bridge of the docking station 96 is connected to the dock I/F 34.

The mini-PCI slot 36 is connected to a network adapter 42 used to connect the computer system 10 to a network (e.g. a LAN such as an Ethernet). The Ethernet adapter 42 is connected to an RJ45 connector 102 located on the rear portion of the PC 12 as shown in FIG. 3 via a flexible cable 100 (to be described later).

The PCI bus 20 and the ISA bus 22 are connected to each other via a PCI-ISA bridge 44. The PCI-ISA bridge 44 is provided with a bridging function used between the PCI bus 20 and the ISA bus 22; a DMA controller function; a programmable interrupt controller (PCI) function; a programmable interval timer (PIT) function; an IDE (Integrated Drive Electronics) interface function; a USB (Universal Serial Bus) function; and an SMB (System Management Bus) interface function. The PCI-ISA bridge 44 has a built-in real time clock (RTC). For example, a PIIX4 chip from Intel Corporation can be used as the PCI-ISA bridge 44.

The DMA controller function transfers data between a peripheral device (e.g. FDD) and the main memory 16 independently of the CPU 14. The PCI function enables a predetermined program (interrupt handler) to be executed in response to an interrupt request (IRQ) from a peripheral device. The PIT function generates a timer signal in programmable predetermined cycles.

The IDE interface realized by the IDE interface function is connected to an IDE hard disk drive (HDD) 46 and to the IDE CD-ROM drive 48 via an ATAPI (AT Attachment Packet Interface).

The PCI-ISA bridge 44 is provided with a USB port connected to a USB connector 50 provided, for example, on the wall surface of the PC 12 body. USB supports hot plugging for connecting and disconnecting a USB peripheral device while the PC 12 is powered and plug-and-play for recognizing a newly connected peripheral device automatically, thereby resetting the system configuration.

Furthermore, the PCI-ISA bridge 44 is connected to an EEPROM 94 via the SM bus. The EEPROM 94 is a non-volatile memory used to hold information such as the password registered by each user and a supervisor password, a product serial number, etc. The data in the memory 94 can be rewritten electrically.

The PCI-ISA bridge 44 is also connected to an electric power circuit 54 via shut-down reset logic 52. Inside the core chip that configures the PCI-ISA bridge 44 is provided power management capability for managing the electric power state of the computer system 10. The electric power circuit 54 controls the supply of the electric power to the computer system 10 according to an instruction from the power management of the PCI-ISA bridge 44.

The ISA bus 22 has a data transfer rate slower than that of the PCI bus 20. The ISA bus 22 is connected to comparatively slow peripheral devices (not illustrated), such as a flash ROM configured by a super I/O controller 70, an EEPROM, etc.; a CMOS 74; and a keyboard/mouse controller.

The super I/O controller 70 is connected to an I/O port 78. The super I/O controller 70 controls the driving of the floppy disk drive (FDD), the input/output of parallel data via a parallel port (PIO), and the input/output of serial data via a serial port (SIO).

The flash ROM 72 is a non-volatile memory used to hold various BIOS programs. The data stored in this ROM 72 can be rewritten electrically. The CMOS 74 is a non-volatile semiconductor memory connected to a backup electric power source. It functions as a fast storage device.

In addition to those shown in FIG. 1, many more electrical circuits are required to configure the computer system 10. However, because those electrical circuits are already known to those of skill in the art and they are not relevant to an understanding of the present invention, they will be omitted in this specification. It will also be noted that only some of the connections between hardware blocks in the drawings are shown in order to simplify the description.

Next, a description will be made of a transmission line pattern formed on the flexible cable 100 connected to an Ethernet adapter 42.

Figure 4:
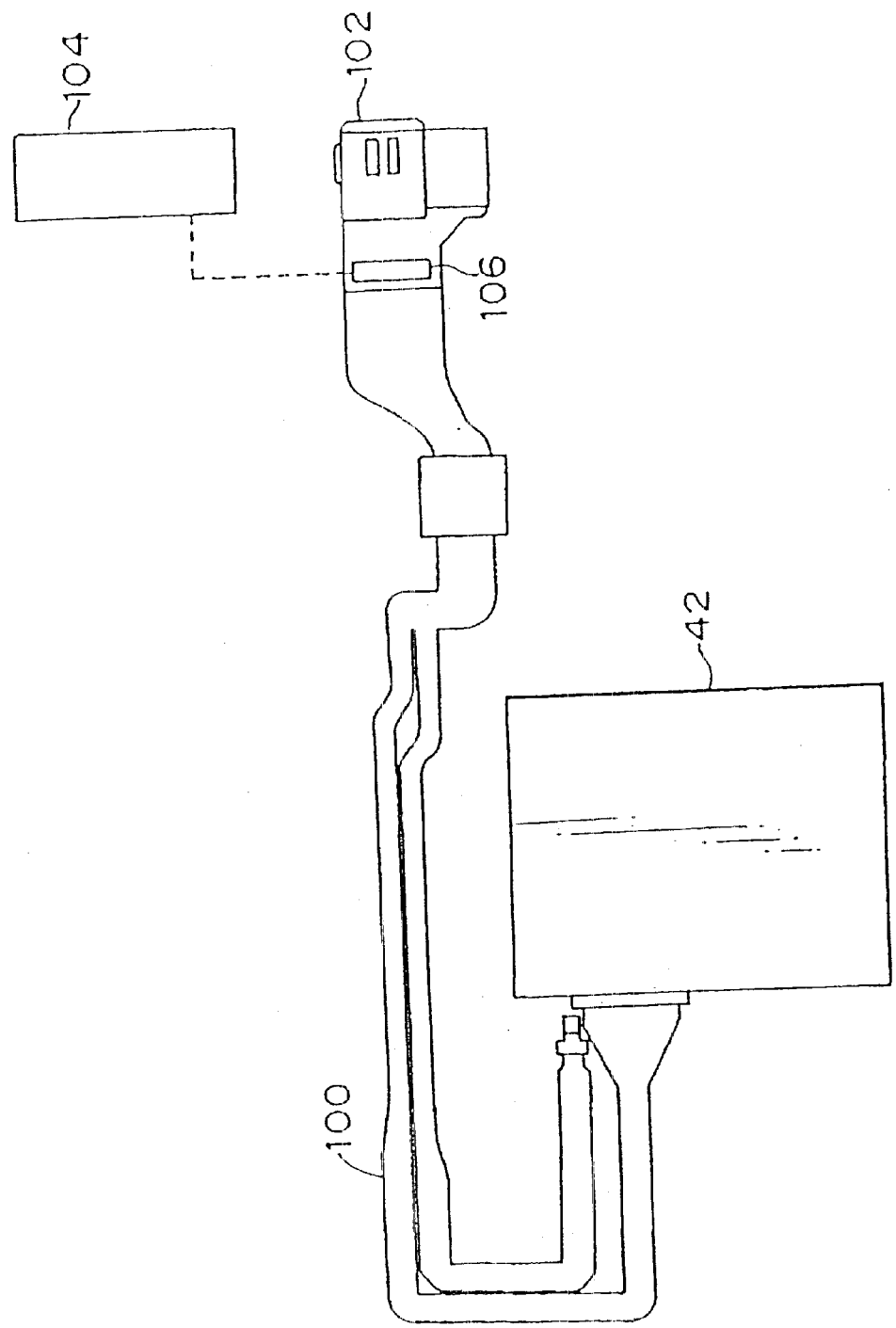
FIG. 4 is a schematic view of a network adapter and a flexible cable.

The Ethernet adapter 42 is connected to the flexible cable 100 as shown in FIG. 4. On the flexible cable 100 is formed an Ethernet pattern of signal transmission lines, connected to the RJ45 connector 102 located at the rear portion of the PC 12 as shown in FIG. 3.

And, as shown in FIG. 4, the flexible cable 100 is provided with a transmission line connector (board to board connector) 106 used to connect the Ethernet pattern to the main board 104 of the PC 12 so as to connect the docking station 96. This transmission line connector 106 is connected to the main board 104 so as to connect the docking station 96 to the network adapter 42 via the main board 104.

Figure 5:
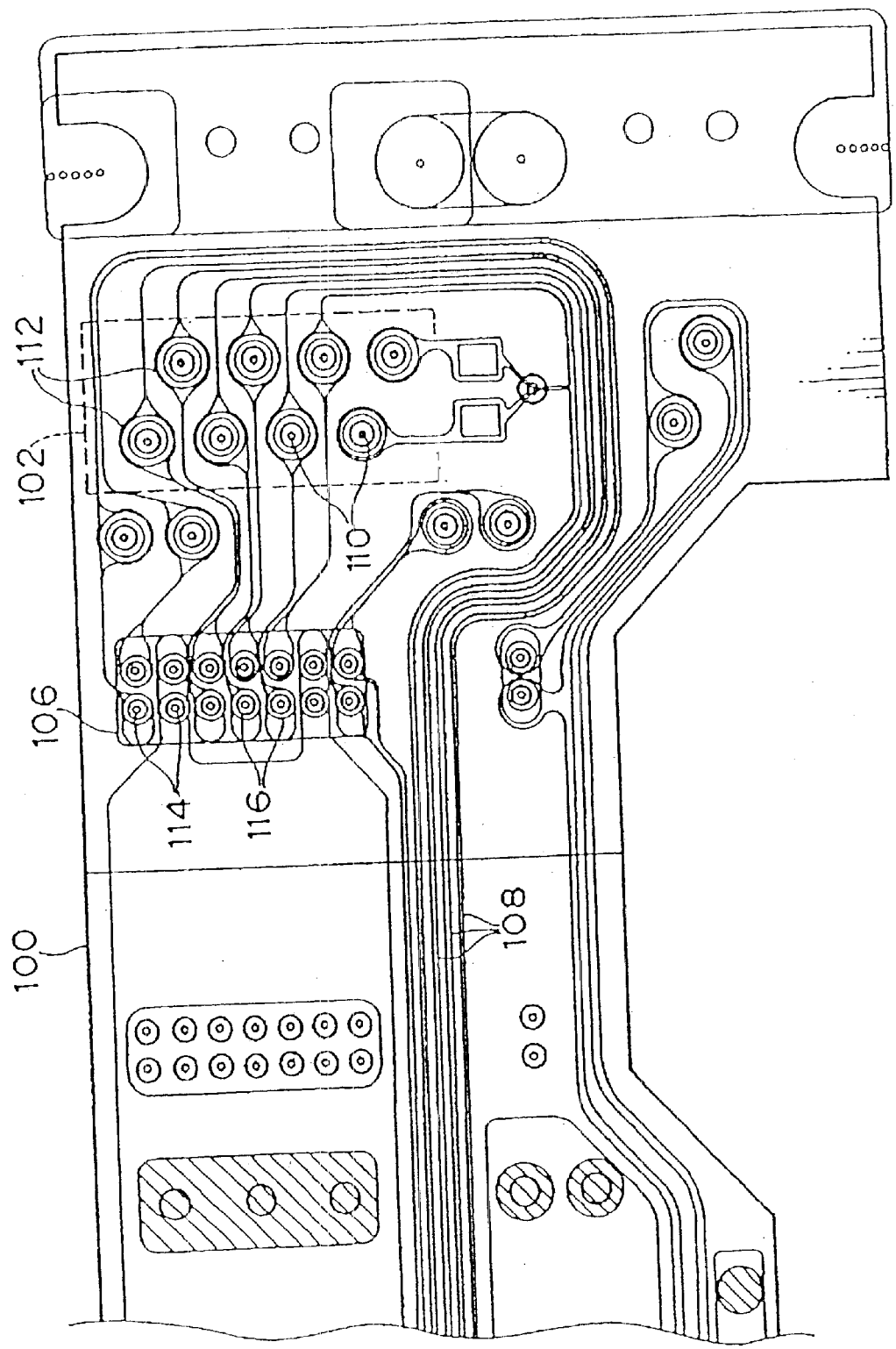
FIG. 5 is a view showing wiring patterns on the flexible cable.

FIG. 5 shows an expanded view of the flexible cable 100 in the region of the transmission line connector 106. As shown in FIG. 5, a pattern of transmission lines 108 is formed on the flexible cable 100.

On the transmission lines 108 are formed lands 112 (terminal areas) for connecting pins 110 of the RJ45 connector 102; and lands 116 for connecting pins 114 of the transmission line connector 106. Each land 112 is connected to a pin 110 of the RJ45 connector 102 and each land 116 is connected to a pin 114 of the transmission line connector 106 by soldering.

The differential impedance of a line pattern of a transmission line network is required to be 100Ω, which is a design target value in an Ethernet transmission line network. Consequently, each transmission line 108 formed on the flexible cable 100 is designed so as to have a differential impedance of 100 Ω.

However, the specific impedance of the transmission line connector 106 is, for example, 65Ω. The connector 106 is used to connect the transmission lines 108 formed on the flexible cable 100 used in the transmission line network to a pattern on the main board 104.

Figure 6:
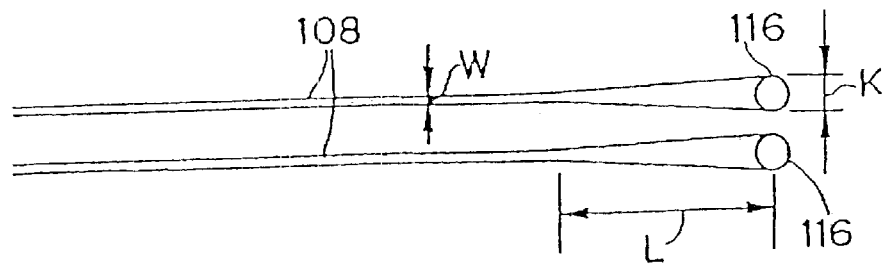
FIG. 6 is a top view of a transmission line pattern.

In accordance with the present invention, the width of a transmission line 108 is changed gradually in the vicinity of connection pin 114 of the transmission line connector 106 as the transmission line reaches the corresponding connection pin 114 as shown in FIGS. 5 and 6. This is to minimize the influences of a return loss, etc. caused at a connector boundary, that is, around the transmission line connector 106 due to a difference between the impedance of the transmission line 108 formed on the flexible cable 100 and the impedance of the transmission line connector 106.

Thereby, because no abrupt impedance change occurs, a return loss otherwise to be expected in the connection area can be suppressed, thereby minimizing the influence of the impedance mismatch around the connector 106.

In the same way, the width of the transmission line 108 can be changed gradually in the vicinity of the connection pin 110 of the RJ45 connector 102 as the transmission line 108 goes towards the corresponding connection pin 110.

Next, a description will be made as to how to calculate a length of the section where the width of a transmission line 108 is changed.

Figure 7:
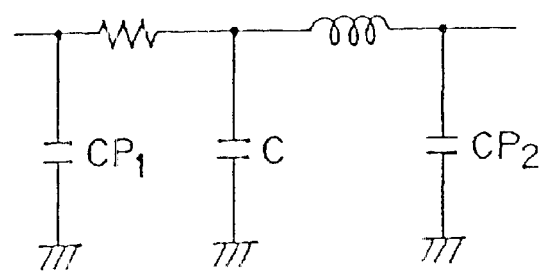
FIG. 7 is a circuit diagram of an equalizing circuit of a transmission line system.

At first, an equivalent circuit (connector lumped constant model) as shown in FIG. 7 is created by taking the flexible cable 100 and the transmission line connector 106 into consideration so as to calculate the above length on the assumption that the flexible cable 100 having a characteristic impedance of 100Ω and the transmission line connector 106 having a characteristic impedance of 65Ω is united into one. Then, an approximate expression is defined as shown below for finding an impedance Z of this equivalent circuit.

$$Z = \sqrt{\frac{L_c}{C/(CP_1 + CP_2)}} \quad (1)$$

And, according to the impedance Z obtained from the expression (1), the area S of a necessary pattern for the target characteristic impedance can be calculated from each of the values R (resistance), $L_c$ (inductance), C (capacitance). Those R, $L_c$, and C values are determined by the material of the transmission line pattern 108 of the flexible cable 100.

Then, the length L and the inclination of the section in which the width W is changed gradually can be found naturally from this found area S, the width W of the transmission line pattern 108, and the diameter K of the land 116 as shown in FIG. 6. The width W of the transmission line pattern 108 and the diameter K of the land 116 are decided by the specifications of the PC 12.

Figure 8:
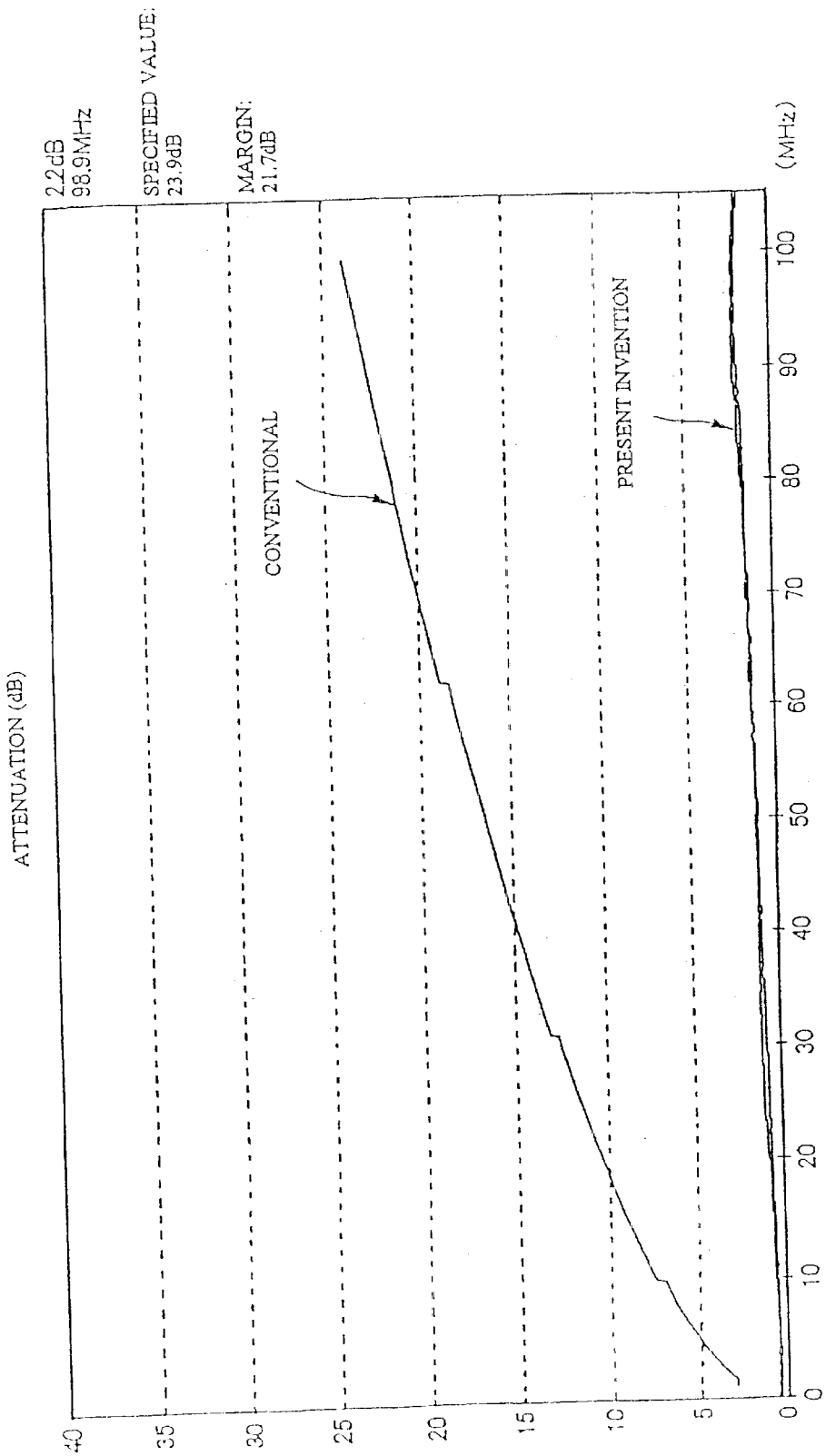
FIG. 8 is a line graph for describing the relationship between a signal frequency and an attenuation.

As an example, it is assumed that the target impedance Z is 100Ω, the width W of the transmission line pattern 108 is 0.3 mm, and the diameter K of the land 116 is 1.5 mm respectively, the length L found as described above becomes 6.5 mm. FIG. 8 shows a measurement result of the attenuation that occurs in the transmission line system. As shown in FIG. 8, the attenuation increases more for higher frequencies when the conventional technique is employed, that is, when the transmission line pattern is not changed gradually around the connector. However, when the transmission line pattern is changed gradually around the connector in accordance with the present invention, no abrupt impedance change occurs around the connector, thereby preventing a return loss. Consequently, the attenuation does not increase so much even when at high frequency. As shown in FIG. 8, for example, the attenuation is about 2.2 dB for a frequency of 98.9 MHz. The attenuation is within the target value ±10% and thus would satisfy the required performance. As compared with the conventional technique within a range of frequencies between 10 MHz to 100 MHz, it has been confirmed that the attenuation is reduced more significantly in the present invention.

While, in the embodiment described above, the transmission line connector 106 is formed on the flexible cable 100, the present invention is not limited thereto; the transmission line connector may be formed on an ordinary printed board.

As described above, according to the present invention, because an transition is formed around a terminal area so that a signal transmission line is connected to a terminal area in the transition region where the predetermined width of the signal transmission line is changed gradually to the specific width of the terminal area as the line goes towards the terminal area, no abrupt impedance change occurs around the terminal area even when the impedance differs between the signal transmission line and the terminal area. Consequently, the return loss to be expected around the terminal area can be reduced, thereby the signal is prevented from attenuation so as to assure normal communications.

What is claimed:

1. A signal transmission cable for connecting a network controller in a data processing system to a main circuit board of said data processing system and for connecting said network controller to an external port of said data processing system, said signal transmission cable comprising:
   a first connector which removably connects said cable to said network controller;
   a second connector which removably connects said cable to said external port;
   a third connector which connects said cable to said main circuit board;
   a plurality of signal transmission lines extending from said first connector to said second and third connectors, each signal transmission line having a predetermined width;
   a plurality of terminal areas connected to said signal transmission lines at said third connector, each terminal area having a specific width different from said predetermined width, said terminal areas acting to input/output a signal onto said signal transmission lines; and
   a plurality of transition regions, each transition region being formed between said signal transmission line and said terminal area so that said predetermined width of said signal transmission line is changed gradually to said specific width of said terminal area.

2. The signal transmission cable according to claim 1, further comprising:
   a second plurality of terminal areas connected to said signal transmission lines at said second connector, each terminal area having a specified width different from said predetermined width; and
   a second plurality of transition regions, each transition region being formed between a signal transmission line and each of said second plurality of terminal areas so that said predetermined width of said signal transmission line is changed gradually to said specified width of each terminal area.

3. A data processing system comprising:
   a main circuit board;
   a network controller electrically connected to said main circuit board: and
   an external port, connected to said network controller by means of a network data transmission cable, for transmitting and receiving network data from and to said data processing system;
   wherein said network data transmission cable further comprises:
   a first connector which removably connects said cable to said network controller;
   a second connector which removably connects said cable to said external port;
   a third connector connecting said cable to said main circuit board;
   a plurality of signal transmission lines extending from said first connector to said second and third connectors, each signal transmission line having a predetermined width;
   a plurality of terminal areas connected to said signal transmission lines at said third connector, each terminal area having a specific width different from said predetermined width, said terminal areas acting to input/output a signal onto said signal transmission lines; and
   a plurality of transition regions, each transition region being farmed between said signal transmission line and said terminal area so that said predetermined width of said signal transmission line is changed gradually to said specific width of said terminal area.

4. The data processing system according to claim 3, wherein the network controller is a mini-PCI network adapter.

5. A cable comprising:
   a first connector which provides removable connection to a network controller;
   a second connector which provides removable connection to an external port;
   a third connector which provides removable connection to a main circuit board;
   a plurality of signal transmission lines extending from said first connector to said second and third connectors, each signal transmission line having a predetermined width, wherein the plurality of signal transmission lines provide simultaneous electrical connection between said first, second and third connectors;
   a plurality of terminal areas connected to said signal transmission lines at said third connector, each terminal area having a specific width different from said predetermined width, said terminal areas acting to input/output a signal onto said signal transmission lines; and
   a plurality of transition regions, each transition region being formed between said signal transmission line and said terminal area so that said predetermined width of said signal transmission line is changed gradually to said specific width of said terminal area.

6. The cable of claim 5, further comprising:
   a second plurality of terminal areas connected to said signal transmission lines at said second connector, each terminal area having a specified width different from said predetermined width; and
   a second plurality of transition regions, each transition region being formed between a signal transmission line and each of said second plurality of terminal areas so that said predetermined width of said signal transmission line is changed gradually to said specified width of each terminal area.

7. A data processing system comprising:
   a main circuit board;
   a network controller electrically connected to said main circuit board; and
   an external port, connected to said network controller by means of a network data transmission cable, for transmitting and receiving network data from and to said data processing system;

wherein said network data transmission cable further comprises:

a first connector which removably connects said cable to said network controller;

a second connector which removably connects said cable to said external port;

a third connector connecting said cable to said main circuit board;

a plurality of signal transmission lines extending from said first connector to said second and third connectors, each signal transmission line having a predetermined width, wherein the plurality of signal transmission lines provide simultaneous electrical connection between said first, second and third connectors;

a plurality of terminal areas connected to said signal transmission lines at said third connector, each terminal area having a specific width different from said predetermined width, said terminal areas acting to input/output a signal onto said signal transmission lines; and a plurality of transition regions, each transition region being formed between said signal transmission line and said terminal area so that said predetermined width of said signal transmission line is changed gradually to said specific width of said terminal area.

8. The data processing system according to claim 7, wherein the network controller is a mini-PCI network adapter.

9. A cable comprising:

a first connector which provides removable connection to a network controller;

a second connector which provides removable connection to an external port;

a third connector which provides removable connection to a main circuit board;

a plurality of signal transmission lines extending from said first connector to said second and third connectors, operatively connected in a multidrop configuration, wherein each of said plurality of signal transmission lines having a predetermined width, wherein said plurality of signal transmission lines provide simultaneous electrical connection between said first, second and third connectors;

a first plurality of terminal areas connected to said plurality of signal transmission lines at said third connector, said first plurality of terminal areas having a specific width different from the predetermined width, said first plurality of terminal areas acting to input/output an electrical signal onto said plurality of signal transmission lines;

a first plurality of transition regions, each transition region being formed between said signal transmission line and said first terminal area so that the predetermined width of said signal transmission line is changed gradually to the specific width of said first terminal area;

a second plurality of terminal areas connected to said signal transmission lines at said second connector, each terminal area having a specified width different from the predetermined width; and a second plurality of transition regions, each transition region being formed between said signal transmission line and said second terminal area so that the predetermined width of said signal transmission line is changed gradually to the specified width of said second terminal area.

10. The multidrop cable according to claim 9, wherein the network controller is a mini-PCI network adapter.

* * * * *